United States Patent
Tran et al.

[11] Patent Number: 6,002,620
[45] Date of Patent: Dec. 14, 1999

[54] METHOD AND APPARATUS OF COLUMN REDUNDANCY FOR NON-VOLATILE ANALOG AND MULTILEVEL MEMORY

[75] Inventors: Hieu Van Tran, San Jose; James Brennan, Jr., Saratoga, both of Calif.

[73] Assignee: Information Storage Devices, Inc., San Jose, Calif.

[21] Appl. No.: 09/005,098

[22] Filed: Jan. 9, 1998

[51] Int. Cl.[6] .................................................. G11C 7/00
[52] U.S. Cl. ........................................ 365/200; 365/225.7
[58] Field of Search ................................. 365/200, 225.7

[56] References Cited

U.S. PATENT DOCUMENTS

| | | | |
|---|---|---|---|
| 4,538,245 | 8/1985 | Smarandoiu et al. | 365/200 |
| 4,546,454 | 10/1985 | Gupta et al. | 365/200 |
| 4,617,651 | 10/1986 | Ip et al. | 365/200 |
| 5,220,531 | 6/1993 | Blyth et al. | 365/189.07 |
| 5,528,540 | 6/1996 | Shibata et al. | 365/200 |
| 5,642,316 | 6/1997 | Tran et al. | 365/200 |
| 5,657,279 | 8/1997 | Savignac et al. | 365/200 |
| 5,796,664 | 8/1998 | Tsuruda et al. | 365/200 |

OTHER PUBLICATIONS

"SST Data Book", Silicon Storage Technology, Inc., pp. 17.1–17.7 (May 1995).

*Primary Examiner*—David Nelms
*Assistant Examiner*—M. Tran
*Attorney, Agent, or Firm*—Blakely, Sokoloff, Taylor & Zafman LLP

[57] ABSTRACT

This invention provides column redundancy circuits in a storage array, which circuits are used in a non-volatile memory chip to increase the production yield due to manufacturing defects. The invention includes a scheme to latch and transfer the redundancy information, a redundancy logic circuit, a redundancy column driver, an array architecture with column redundancy, a scheme to program and read the column redundancy memory cells, a scheme to multiplex the fuses, and circuits to use an out-of-bound address as a column redundancy enable/disable signal.

20 Claims, 16 Drawing Sheets

С. 002,620

METHOD AND APPARATUS OF COLUMN REDUNDANCY FOR NON-VOLATILE ANALOG AND MULTILEVEL MEMORY

BACKGROUND OF THE INVENTION

1. Field of the Invention

The present invention relates to the field of redundancy circuits used to increase the production yield of non-volatile memory integrated circuits.

2. Prior Art

For non-volatile memory integrated circuits, especially for high density memory arrays, particle defects which can occur due to fabrication environments normally cause the memory array to fail, leading to yield loss in production final test, increasing the cost of the final product. A technique commonly known as redundancy repair (row or column or block) can be used in many cases to repair the failed memory portion. The redundancy circuits typically store the failed addresses in some form of storage, and compare the incoming addresses with the stored redundancy addresses for a match. If a match is found, the redundancy array is enabled and the main array is disabled, typically by way of an enable fuse.

Some conventional implementations use a resistor fuse as a one time programmable element to store the failed addresses. The fuse is blown by applying a high current through the fuse by some test enabling circuit. Because the fuse blowing current is high, the transfer switch must be large, requiring a large chip area. Other implementations use EPROM (electrically programmable read only memory). EPROM fuses are also one time programmable, and require complicated metal shielding over the fuse after programming to retain the charge. Other implementations use EEPROM (electrically erasable programmable read only memory) fuses. EEPROM fuses are typically large compared to the flash fuses used herein.

In U.S. Pat. No. 4,617,651 by W. Ip and G. Perlegos and U.S. Pat. No. 4,538,245 by G. Smarandolu and G. Perlegos, the redundancy is row redundancy only, not column redundancy as in the present invention. Further, the redundancy scheme is not applicable to analog signal sample storage due to the requirement of sampling and writing at the same time. Also, a redundancy disable/enable circuit is required for each redundancy row. In the present invention, out-of-bound addresses are used for self enabling, thus eliminating the redundancy disable/enable circuit. Also, in the '651 and '245 patents, the redundancy element is a one time programmable fuse versus the source side injection flash fuse of the present invention. The flash fuse of the present invention enables the redundancy to be programmable many times, and eliminates the need for devices capable of high current as required to burn a one time programmable fuse.

In U.S. Pat. No. 5,642,316 by H. V. Tran and T. Blyth, the redundancy is row redundancy, not column redundancy, and the memory fuses are EEPROM fuses instead of flash fuses. The row redundancy is not applicable to column redundancy due to the requirement of writing and sampling at the same time.

BRIEF SUMMARY OF THE INVENTION

This invention provides column redundancy circuits in a storage array, which circuits are used in a non-volatile memory chip to increase the production yield due to manufacturing defects. The invention includes a scheme to latch and transfer the redundancy information, a redundancy logic circuit, a redundancy column driver, an array architecture with column redundancy, a scheme to program and read the column redundancy memory cells, a scheme to multiplex the fuses, and circuits to use an out-of-bound address as a column redundancy enable/disable signal.

DETAILED DESCRIPTION OF THE INVENTION

Figure 1A:
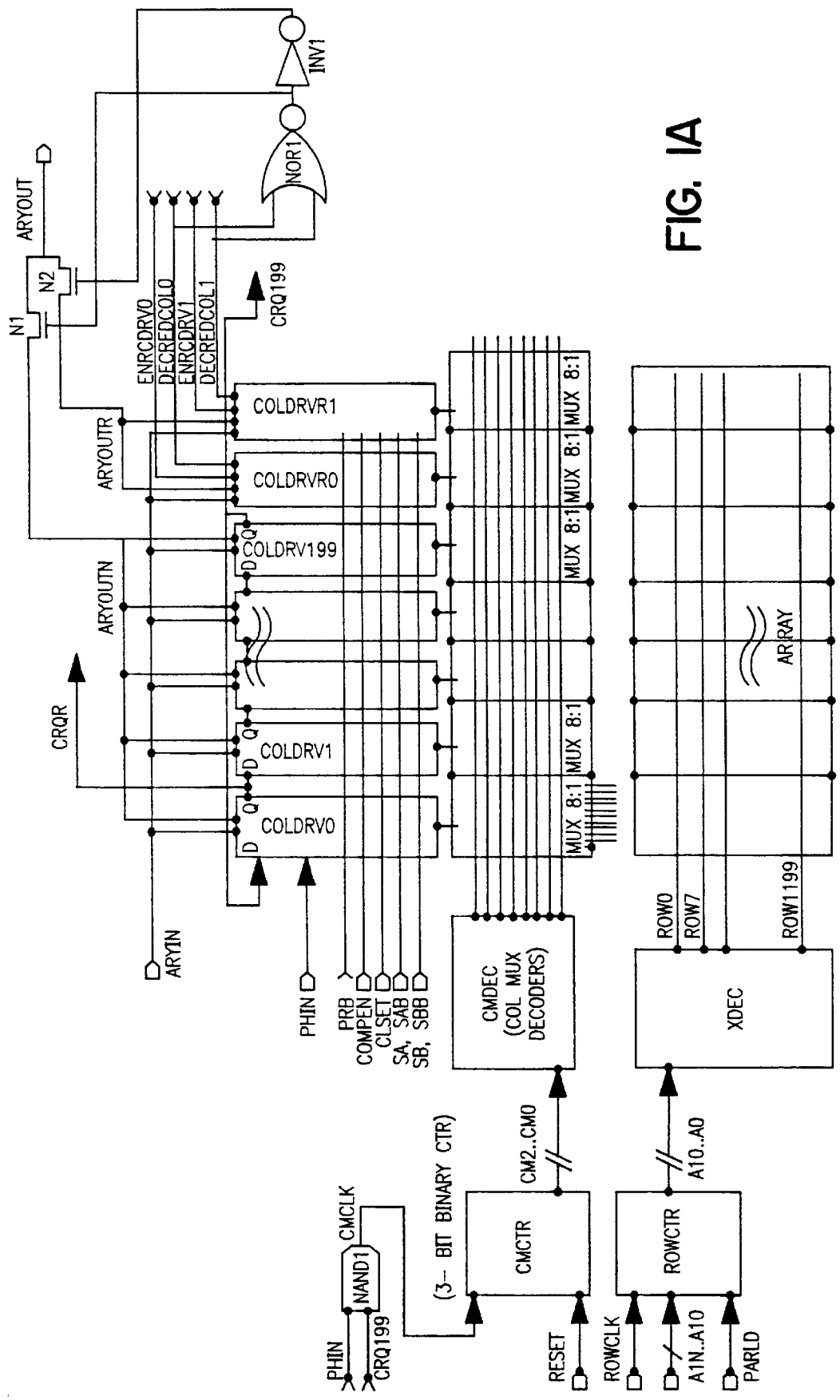
FIG. 1 is a block diagram of the preferred embodiment of the present invention.
Figure 1B:
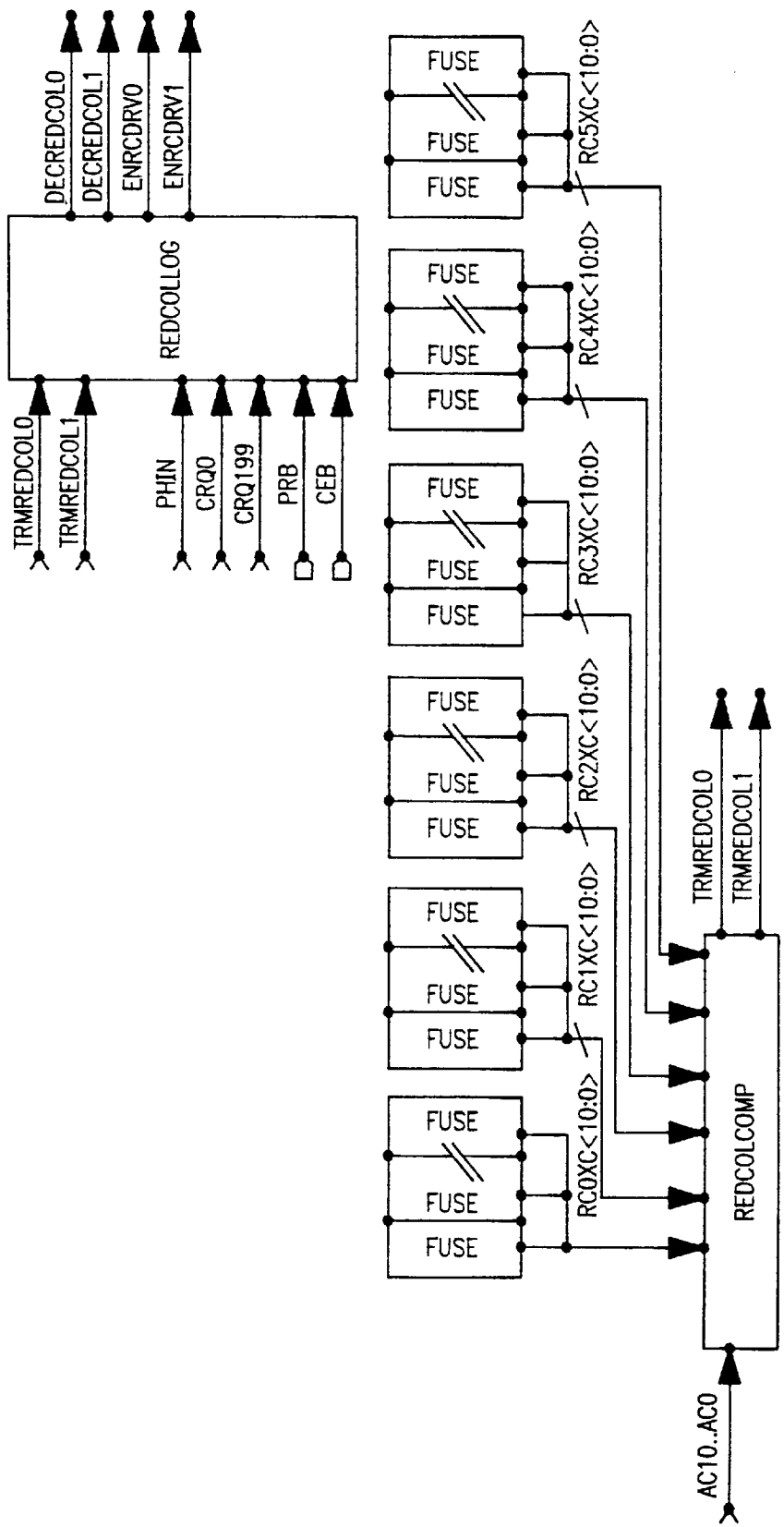

First referring to FIG. 1, a block diagram of the preferred embodiment of the present invention, including column redundancy, may be seen. As shown therein, the memory array includes a main array and a column redundancy array, in this embodiment embedded at the right side of the main array, though the redundancy array could be placed anywhere in the overall memory array, as the redundancy columns are exactly the same as the main array columns.

Figure 7:
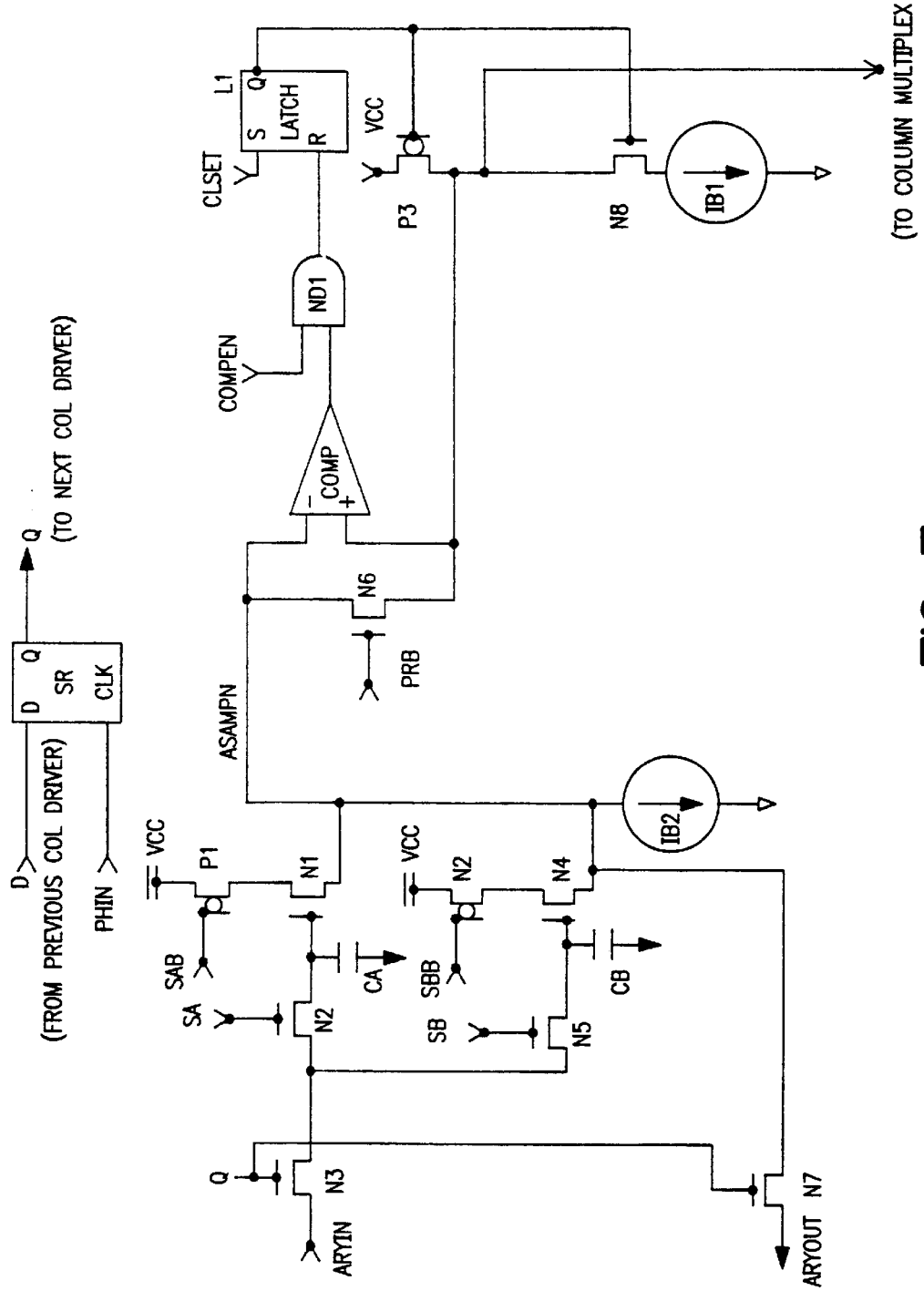
FIG. 7 is a circuit diagram for each of the main array column drivers.

In the embodiment shown, the main array comprises 1600 columns, organized in 200 groups of eight columns, each column being driven through a respective one of 200 column drivers COLDRV0 through COLDRV199, each column driver driving a respective one of the eight columns associated therewith through a respective one of the 8:1 MUXes coupled thereto. The redundancy array comprises 16 columns, organized in 2 groups of eight columns. Like in the main array, each of the two columns of the redundancy array is driven through a respective one of 2 column drivers COLDRVR0 and COLDRVR1, each column driver driving a respective one of the eight columns associated therewith through the 8:1 MUX coupled thereto. Details of the main array column drivers are shown in FIG. 7 and of the redundancy column drivers in FIG. 8.

The preferred embodiment of the invention is used in an analog sample storage and play-back system. Accordingly, the following discussion will assume an analog non-volatile memory application. An analog non-volatile memory cell of the preferred embodiment can typically store an analog sample with a resolution on the order of one part in 250 or better. The storage capacity of the preferred embodiment for the stated array size is 240 seconds. This recording duration, divided by one over the audio sampling rate of 8 KHz, requires 240 seconds/125 $\mu$s=1.92M cells, where each cell is equivalent to 125 $\mu$s. While the array herein is divided into 1600 columns and 1200 rows to provide the 1.92M cells, other divisions, sample rates and recording times are of course possible.

The array can be externally accessed by row address only. Each row of the array is divided into 8 scans, each scan being equal to 25 ms or 200 cells. Twenty-five milli-seconds is the audio resolution, in that an audio signal is sampled at 8 KHz, but 200 samples are stored in 200 cells at a time, so that audio samples are taken and stored, and played back, in time increments of the analog signal of 25 ms. The whole row can thus be programmed or read back in 8 scans. The column drivers therefore only drive 200 cells at the same time, so the number of column drivers are 200, as stated before. Thus the 8:1 MUXes are needed to connect the 200 column drivers to the 1600 columns.

Replacement of the bad columns in the main array with columns of the redundancy array is done at the time of factory production testing. First any bad columns in the main array and redundancy array are identified, then the bad column address fuses are programmed, such as described when referring to FIG. 9 and FIG. 10. Once the fuses are programmed, the bad columns in the main array are replaced by good columns in the redundancy array whenever the bad columns in the main array are addressed.

The row decoder XDEC is a typical binary decoder, and the row counter ROWCTR is a typical parallel load binary counter. The addresses into the row counter ROWCTR are loaded in parallel on occurrence of the parallel load signal PARLD and are incremented to the next row at the end of the last (eighth) scan for each row by the ROWCLK signal. The XDEC is a typical row decoder which accepts row addresses A10 . . . A0 and does binary decoding to select any one row from ROW0 to ROW1199.

The column MUX counter CMCTR is a typical 3-bit binary counter which may be reset by the reset signal RESET. The column MUX decoder CMDEC is a typical binary decoder which accepts column MUX address bits CM2 . . . CM0 and does a binary decoding to select one of the eight columns controlled by each column driver. The NAND gate NAND1 is used to provide the column MUX clock by ANDing sample clock PHIN and CRQ199, which, once CRQ199 goes high, indicates a count of 200 has been reached, i.e. the current scan is done and the next scan is to begin. The column MUX decoder CMDEC is the scan decoder, as each column MUX counter advance will advance the column MUXes to the next scan.

Also shown in FIG. 1 are six sets of eleven fuses each, each set having fuses FUSE0 through FUSE10. In the preferred embodiment, the fuses are the same reprogrammable cells as the storage cells in the main and redundancy arrays, though are programmed in use to hold digital (on or off) information for determining when one or more redundancy columns are to be called into play.

Figure 9A:
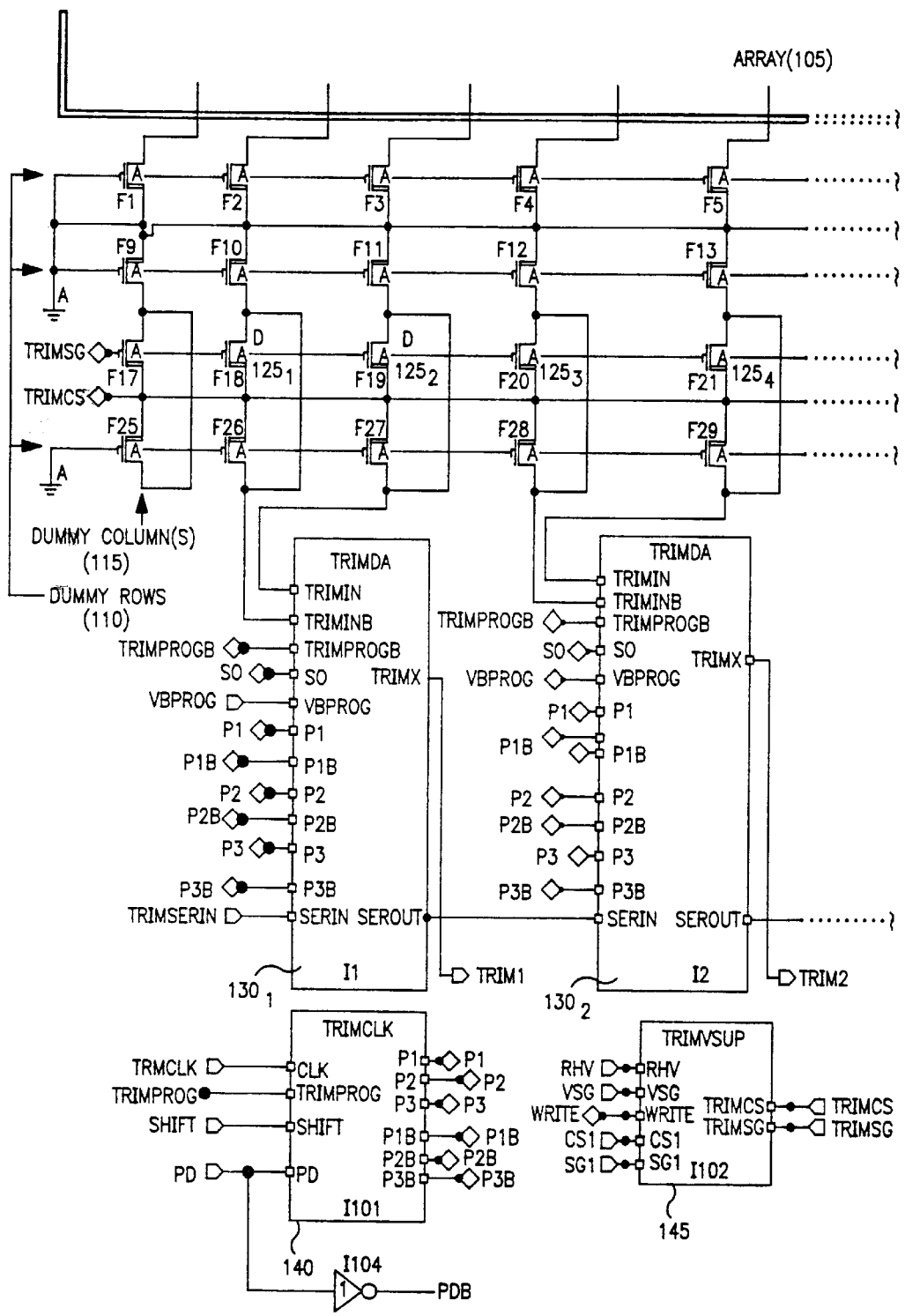
FIG. 9 is a diagram of an exemplary embodiment of a plurality of fuses for use in the present invention.
Figure 9B:
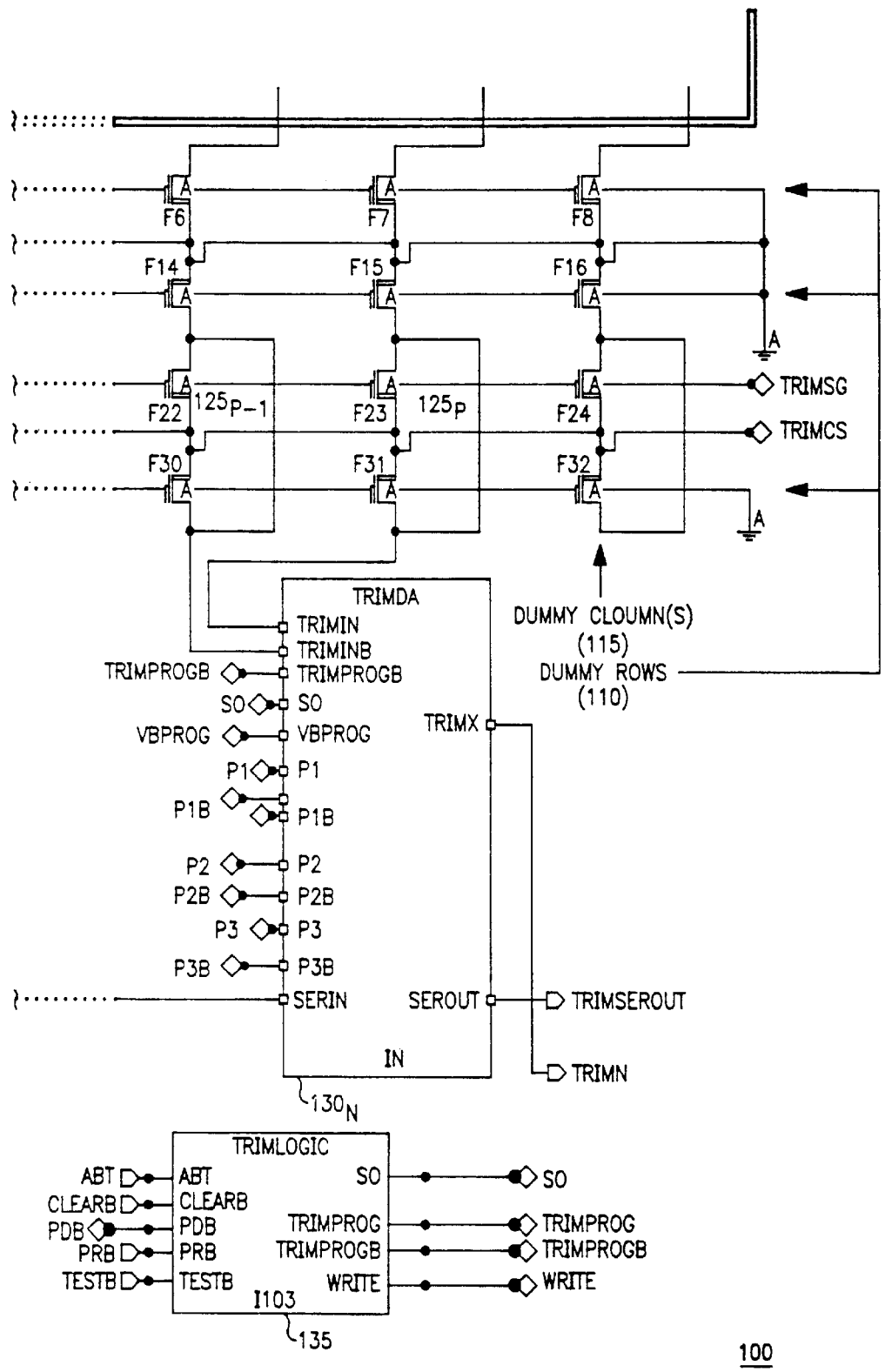

FIG. 9 is an exemplary embodiment of the plurality of fuses (e.g., FUSE0, FUSE1, etc.) for use in the present invention. Referring to FIG. 9, each fuse includes a pair of adjacent flash memory trimcells (e.g., $125_1$ and $125_2$, $125_3$ and $125_4$, . . . , $125_{P-1}$ and $125_P$) and a corresponding fuse circuit $130_1$–$130_N$. Each fuse circuit $130_1$–$130_N$ includes a serial input terminal SERIN and a serial output terminal SEROUT to serially load in values in the fuse circuits $130_1$–$130_N$. The values loaded in the fuse circuits are used to program one of the corresponding pair of adjacent trimcells.

Figure 10:
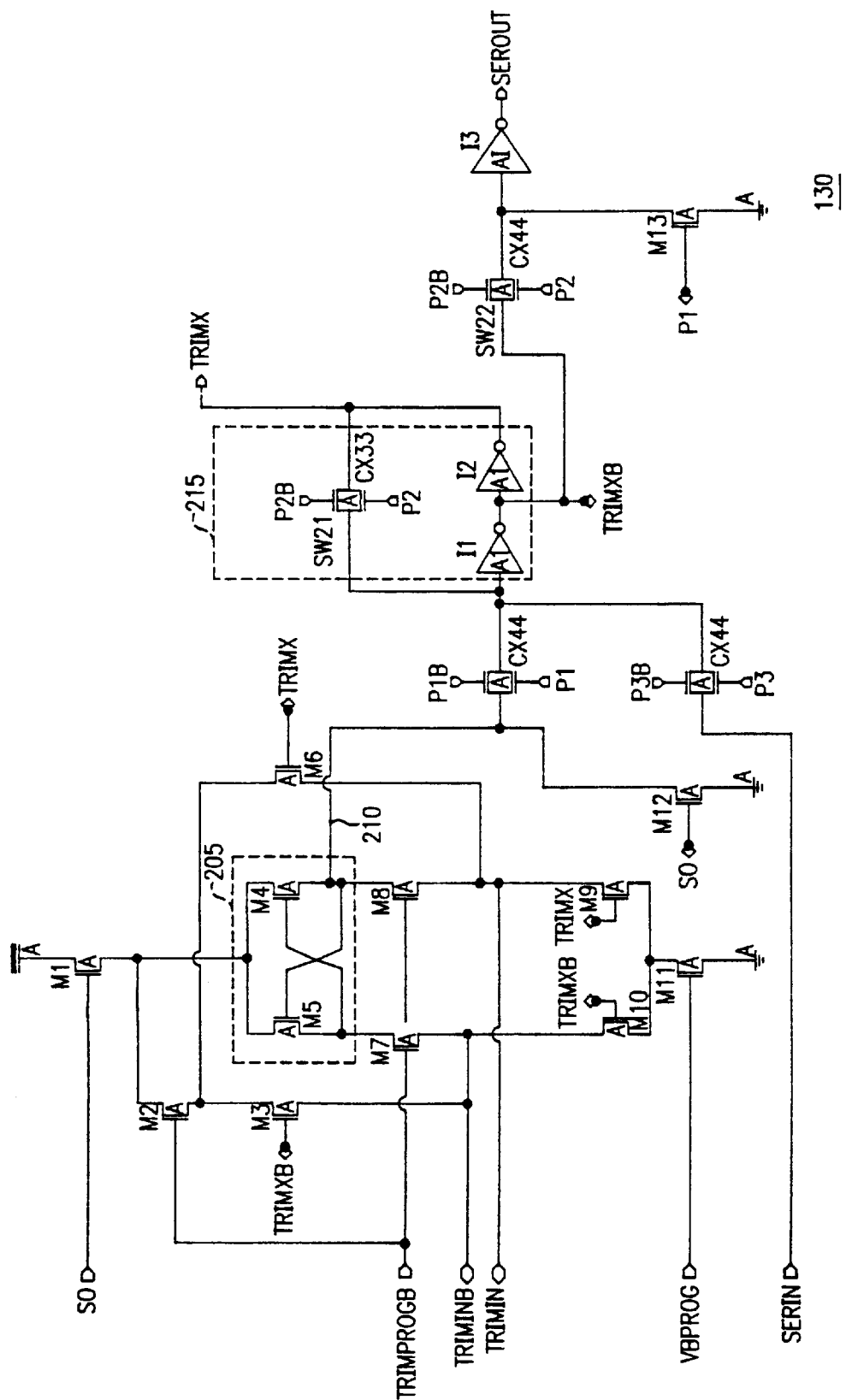
FIG. 10 is a circuit diagram of the fuse circuit of FIG. 9.

FIG. 10 illustrates a circuit diagram of a fuse circuit 130 of FIG. 9. The fuse circuit 130 includes four main modes of operation, namely, Read, Program, Erase, and Shift. The signals for the first three modes of operation are generated by a TRIMLOGIC circuit, the signals for the Shift mode of operation are generated by a TRIMCLK circuit 140, and a TRIMVSUP circuit 145 provides a select gate voltage TRIMSG and a common source voltage TRIMCS to the flash memory trimcells $125_1$–$125_P$. The fuse circuit 130 provides a fuse output TRIMX and includes a first latch 205 having devices M4 and M5. The devices M4 and M5 are gated by devices M8 and M7, respectively. The first latch 205 has an output 210 which is coupled to a bi-lateral switch SW1.

Referring to FIGS. 9 and 10, flash memory trimcells $125_1$ and $125_2$ are coupled to devices M7 and M8 of the first latch 205 by way of terminals TRIMINB and TRIMIN, respectively. In the Read mode, the sources of the flash memory trimcells $125_1$ and $125_2$ are tied to ground and the gates of the flash memory trimcells $125_1$ and $125_2$ are selected. When high, the signal TRIMPROGB passes the drain currents of the trimcells $125_1$ and $125_2$ to the devices M5 and M4. Trimcells $125_1$ and $125_2$ are used to generate a differential current which is applied to and amplified by the fuse circuit 130. In particular, one of the flash memory trimcells $125_1$ and $125_2$ is programmed and will have a high threshold voltage, thus causing a small drain current. The other of the flash memory trimcells $125_1$ and $125_2$ is erased and will have a low threshold voltage, thereby generating a high drain current. The operation of the flash memory trimcells is described in more detail later, in the "Circuit Operation" section.

Additionally, in the Read mode, signal P1 is high to turn on bi-lateral switch SW1, while signals P2 and P3 are low to turn off switches SW21 and SW3, respectively. The fuse output is available at TRIMX. In the Shift mode, signal P1 is low to turn off switch SW1 and disconnect the first latch 205 from a shift path and signal P2 becomes high to turn on switch SW21. The shift path commences from the serial input terminal SERIN through a switch SW3 to the fuse output TRIMX and also through a switch SW22 to the serial output terminal SEROUT. With signal P2 high, the combination of the switch SW21 and inverters I1 and I2 connected in parallel act as a latch (i.e., a second latch 215).

In the Programming mode, a trimbit is stored in the second latch 215 (e.g., by serially shifting in the trimbit) and provided on the fuse output TRIMX. The fuse output TRIMX is used to switch on the programming current for one of the two flash memory trimcells $125_1$ and $125_2$. The programming current is set by VBPROG. The drain of the flash memory trimcell that is not being programmed is pulled up high to the supply voltage. The signal TRIMPROGB is low in the programming mode to disconnect the first latch from the trimcells $125_1$ and $125_2$.

In the Erase mode, the common sources of the flash memory trimcells $125_1$ and $125_2$ are tied to ground while the gates are tied to VERASE (e.g., 15 Volts). Moreover, in the Erase mode or an optional Power Down mode, signal S0 is used to disconnect the supply voltage (turn device M1 off). Signal S0 is pulled high in the Power Down mode or in an optional Test mode to set the trimbit output TRIMX to zero. The embodiments of FIGS. 9 and 10 are described in detail in co-pending United States patent application entitled "Trimbit Circuit for Flash Memory Integrated Circuits", by Holzmann et al., Application Ser. No. 09/005,074, filed concurrently herewith and assigned to the assignee of the present invention.

Referring back to FIG. 1, the redundancy column comparator REDCOLCOMP compares the column addresses programmed into the six sets of fuses with the current column address AC10 . . . AC0, and on detecting an exact match, outputs signals to the column redundancy control logic REDCOLLOG which in turn outputs signals to control NOR gate NOR1 and inverter INV1 to make the redundancy memory cells active instead of the normal memory cells by turning on transistor N2 and turning off transistor N1. The operation of these circuits will be described in greater detail later.

Figure 2A:
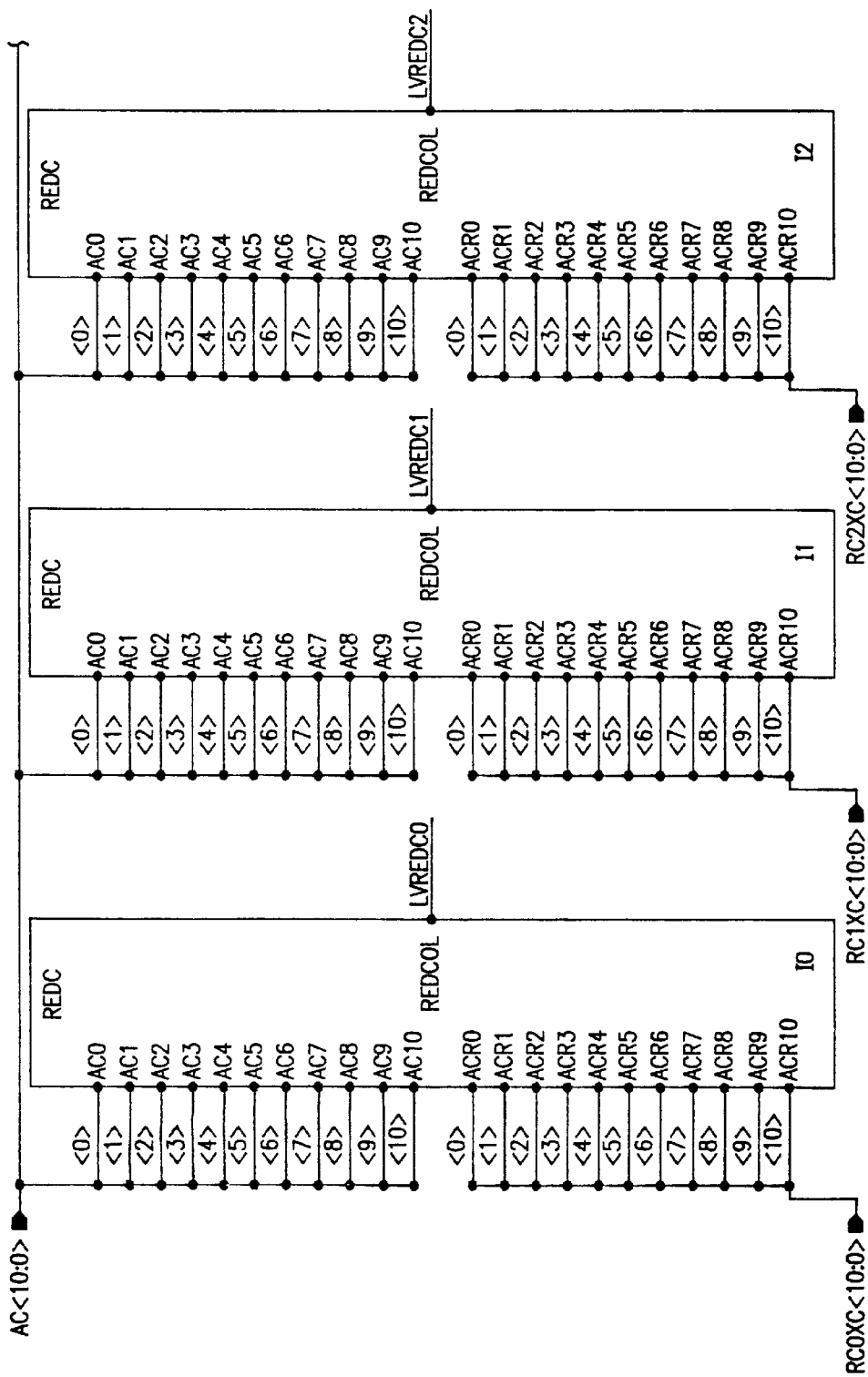
FIG. 2 is a circuit diagram showing the details of the column redundancy comparator REDCOLCOMP of FIG. 1.
Figure 2B:
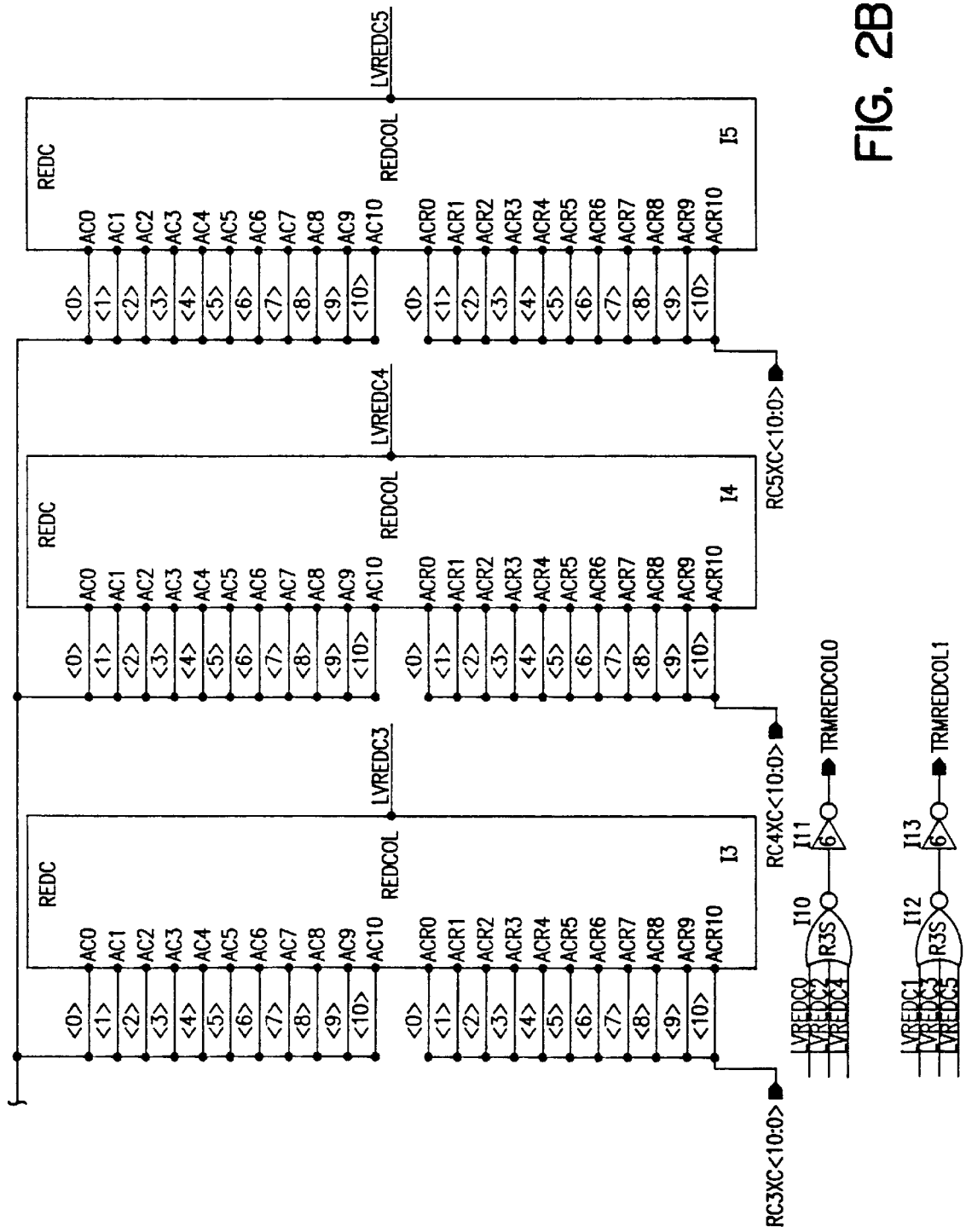

Now referring to FIG. 2, details of the column redundancy comparator REDCOLCOMP of FIG. 1 may be seen. The redundancy comparator REDCOLCOMP comprises six comparators, each comparing two eleven-bit signals, bit by bit, and outputting a one only if the two signals are identical. As may be seen in FIGS. 1 and 2, one signal provided to all six comparators is the eleven bit column address AC10 . . . A0. The other signal is the output of the respective set of eleven fuses, herein before described with respect to FIG. 1. Initially the fuses, being reprogrammable, are programmed to provide an address which is out of the addressing range of the 1600 columns of the main array, the possible addressing range for 11 bits being 2048. Thus initially, the fuses may be fully in circuit and operational, yet not provide an address to the redundancy column comparators which would yield an address comparison during the normal operation of the main array. This avoids the need for additional fuses as enable/disable fuses, normally used for redundancy circuits.

Figure 3A:
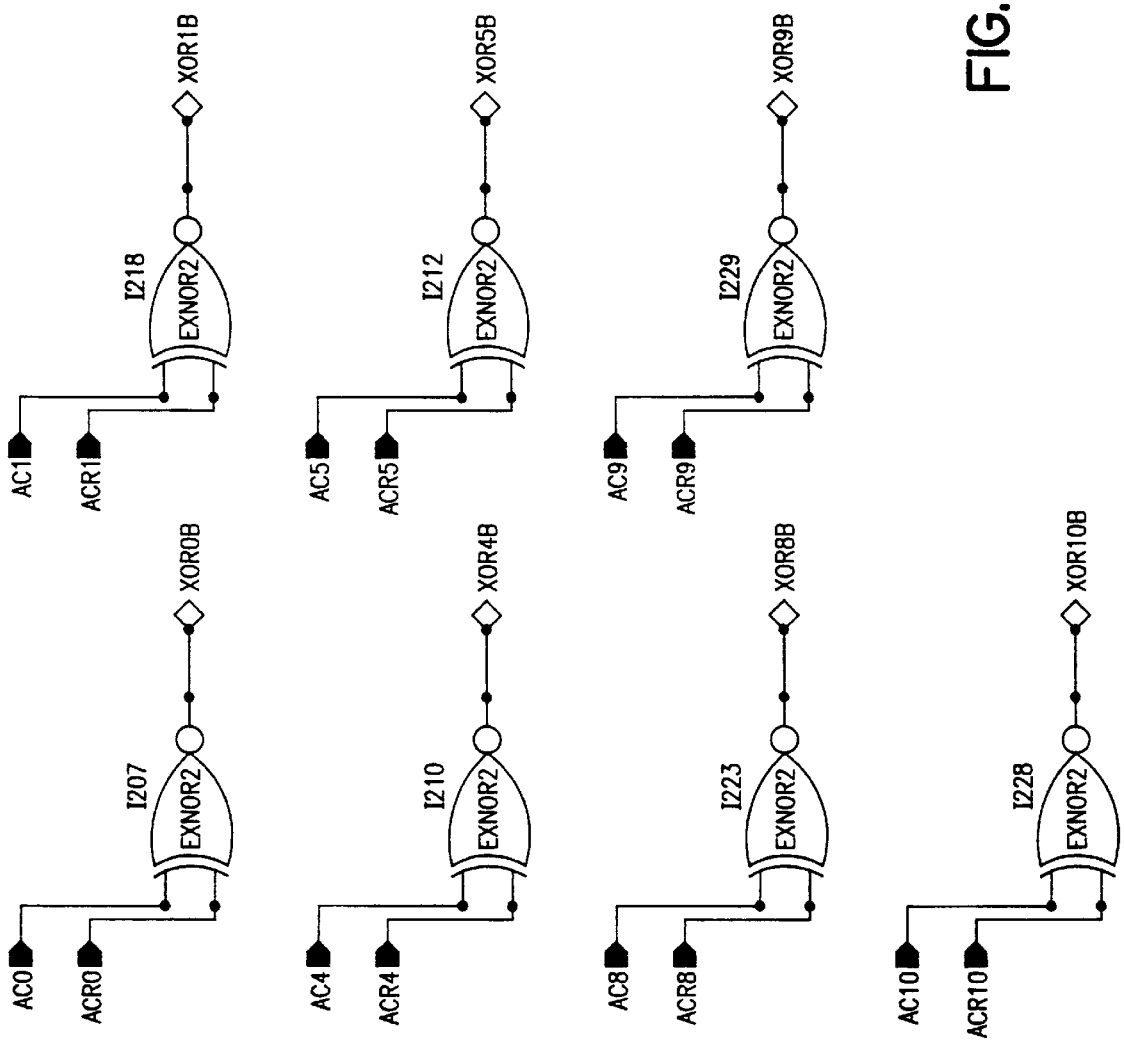
FIG. 3 is a circuit diagram for the 11 bit comparator used to compare the 11 fuses with equivalent column addresses AC10 . . . AC0.
Figure 3B:
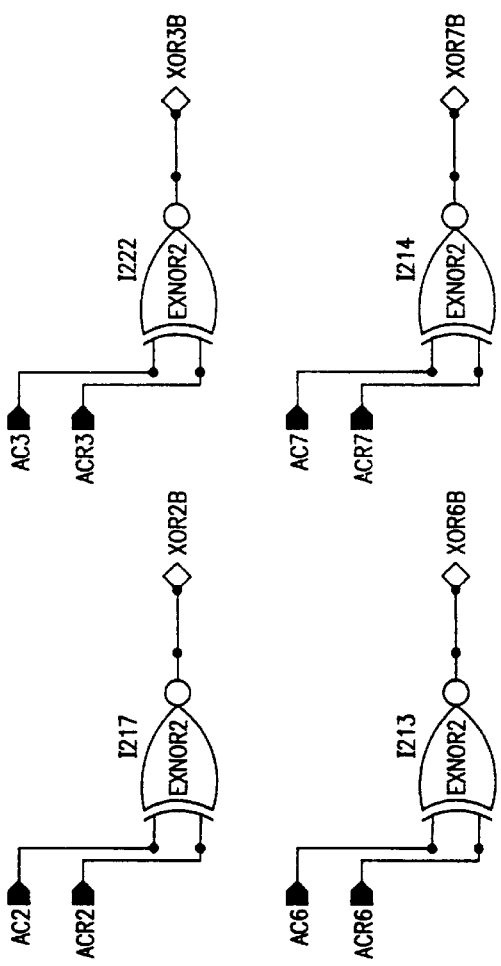
Figure 3B:
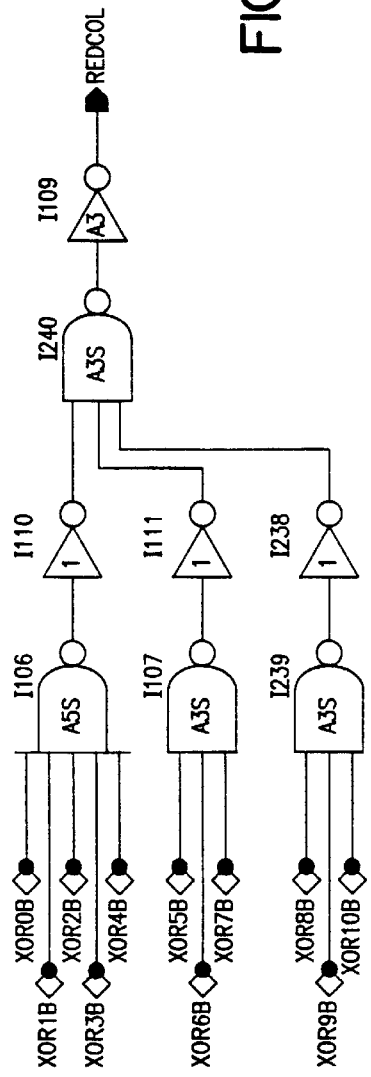

As may be seen in FIG. 2, the outputs of the first, third and fifth sets of fuses are ORed together (actually NORed and inverted), and the outputs of the second, fourth and sixth comparators are ORed together. The outputs of this block are used to control the two redundancy column drivers, as later described in greater detail. Each of the comparators shown in FIG. 3 use exclusive-NOR gates to compare the 11 fuses with equivalent column addresses AC10 . . . AC0, and output a one if the two are the same and a zero otherwise. Note that the eleven bit column address AC10 . . . AC0 has an addressing capability of $2^{11}$ or 2048, quite in excess of the number of individual columns needed to be addressed to individually address each of the 1600 columns of the main array.

Figure 4A:
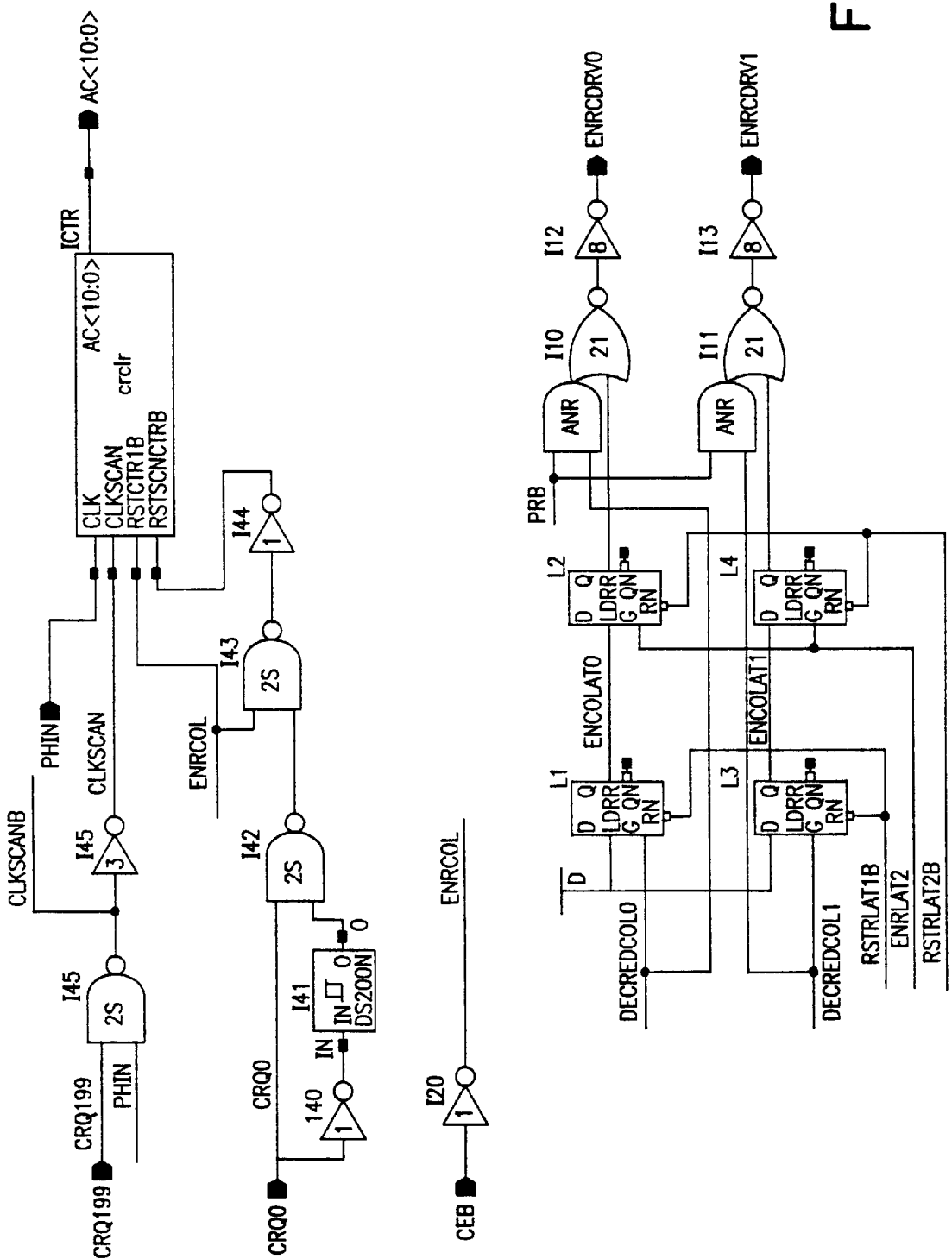
FIG. 4 is a circuit diagram for the column redundancy control logic REDCOLLOG of FIG. 1.
Figure 4B:
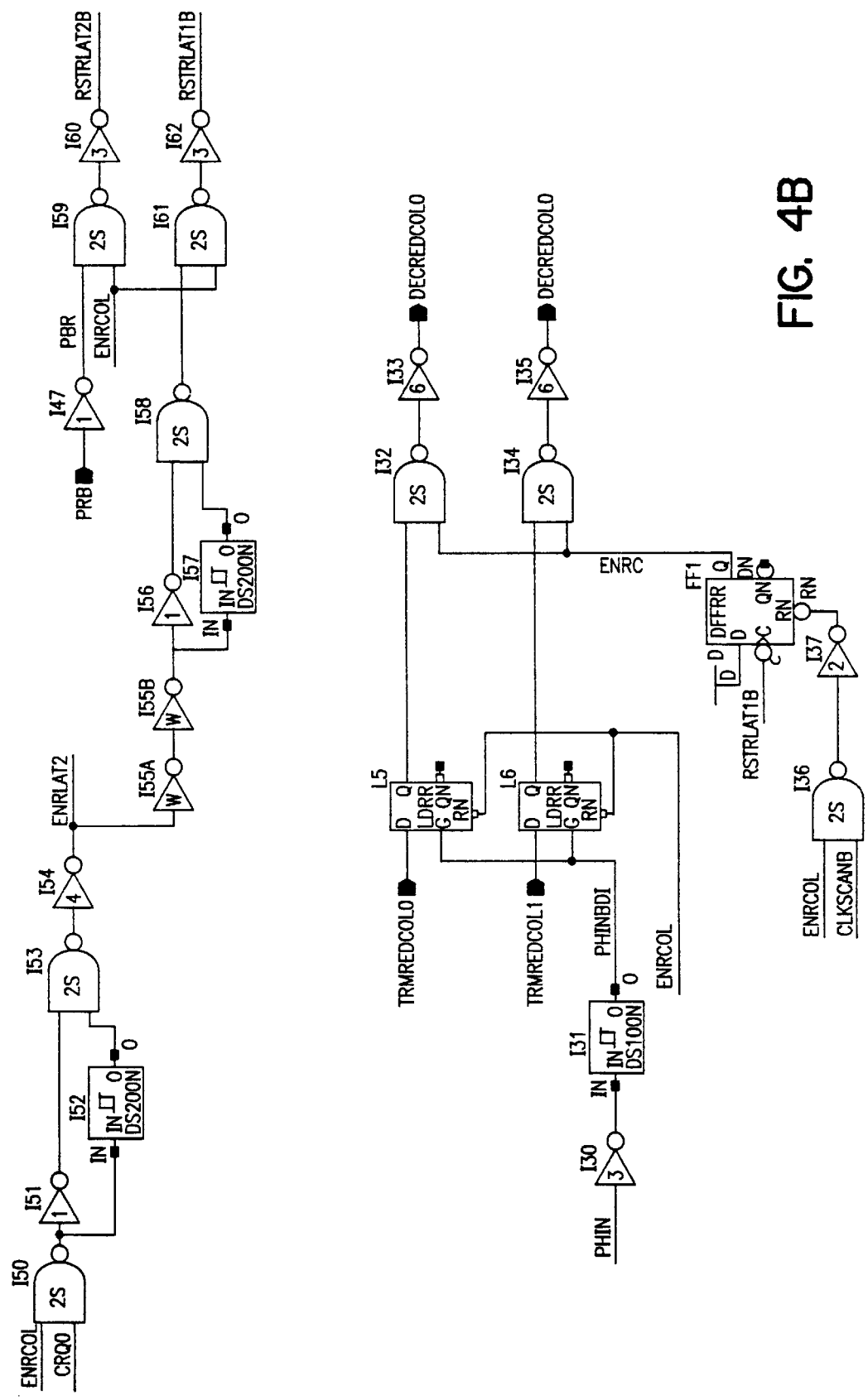

Now referring to FIG. 4, details of the column redundancy control logic REDCOLLOG of FIG. 1 may be seen. In the analog storage devices in which the present invention is used, the column addresses are internal to the device. Therefore in the preferred embodiment, the column addresses are effectively reconstructed by counter CRCTR (actually two counters as shall be subsequently described in greater detail), providing counter outputs AC<10:0>. The comparator REDCOLCOMP then compares the AC<10:0> with the redundancy address bits provided by the memory fuses. If a match is found, TRMREDCOL0 or TRMREDCOL1 is valid, which is latched in latch L5 or latch L6 by the latch clock signal PHINBDL. PHINBDL is purposely delayed to avoid the glitch caused by the ripple counter CRCTR.

The signals DECREDCOL0 and/or DECREDCOL1 are used to enable the sampling of the input voltages into the redundancy column sample and hold in the redundancy column drivers. Also the input voltages are sampled into the regular column sample and hold capacitor, but this does not matter. The signals DECREDCOL0 and/or DECREDCOL1 then are latched in latches L1 and/or L3 before they go away by the next sampling clock by the end of the scan. At the end of the scan, the signal DECREDCOL0 and/or DECREDCOL1 are then transferred to latches L2 and/or L4 to enable the appropriate redundancy column drivers COLDRVR0 and/or COLDRV1 as needed for writing (analog signal sample storage). Latches L2 and L4 are needed to enable the redundancy column drivers during the writing so that latches L1 and L3 can latch the information on the next bad column. Latches L1 and L3 are needed to hold the redundancy until the end of the scan because the information on latches L5 and L6 will be gone by the next sampling clock. The signal ENRC is used to disable the DECREDCOL0/1 at the end of the scan until the transfer from latches L1/L3 to L2/L4 is done. Otherwise DECREDCOL0/1 could become active, which would cause latches L1/L3 to latch the current redundancy decoding instead of that from the last sampling decoding. In the circuit shown, inverter I20 simply inverts the CEB signal. The above description is basically the scheme to latch and transfer the redundancy information in recording.

NAND gate I45 and inverter I46 provide a clock signal once a scan is finished by ANDing CRQ199 and PHIN. One scan is defined as the time during which the column shift register (shown as SR in FIG. 7) shifts a "one" from column driver number 0 to column driver number 199.

Inverter I40, delay I41 and NAND gate I42 provide a one-shot reset for the 7-bit counter. When the "one" is cycled from the column driver number 199 to the column driver number 0, the signal CRQ0 will go active high, which with inverter I40, delay I41 and NAND gate I42, provides a one-shot active low to reset the 7-bit counter inside the CRCTR.

Inverter I30 and delay I31 provide a 100 ns delay signal PHINBDL. This signal, together with latches L5 and L6, de-glitches the glitch caused by the address AC<10:0> from the ripple counter. This is accomplished by waiting 100 ns for the ripple counter to finish rippling and the redundancy column comparators REDCOLCOMP to finish comparing.

NAND gate I36, inverter I37 and flip-flop FF1 provide signal ENRC for NAND gates I32 and I34 coupled to inverters I33 and I35. The purpose of NAND gate I36, inverter I37 and flip-flop FF1 is to provide a disable signal when the decoding happens at the end of the scan until the transfer from latches L1 and L3 to latches L2 and L4 is complete, as previously discussed.

NAND gate I50, inverter I51, delay circuit I52, NAND gate I53 and inverter I54 provide an active high, 200 ns one-shot signal ENRLAT2. Inverters I55A and I55B delay this signal further by two weak inverter delays. Inverter I56, delay circuit I57, NAND gates I58 and I61, and inverter I62 provide an active low, 100 ns one-shot signal RSTRLAT1B. The purpose of RSTRLAT1B is to reset the DECREDCOL0 and DECREDCOL1 signals when chip enable CEB is high and to provide a reset after the transfer of information from latches L1 and L3 to latches L2 and L4, respectively, is finished. The information transfer is done by the signal ENRLAT2. The delay by weak inverters I55A and I55B is to make sure the transfer is done before resetting the latches L1 and L3. The signal RSTRLAT2B is reset by CEB being high and by PRB being high.

Complex gates I10 and I11 and inverters I12 and I13 are used to transfer the information from latches L2 and L4 to ENRCDRV0/1 in record mode and to transfer the information from DECREDCOL0/1 to ENRCDRV0/1 in the play mode. This is because in the play mode, there is no sampling of the analog input voltage in the column drivers and holding of these samples until the end of the scan.

Figure 5:
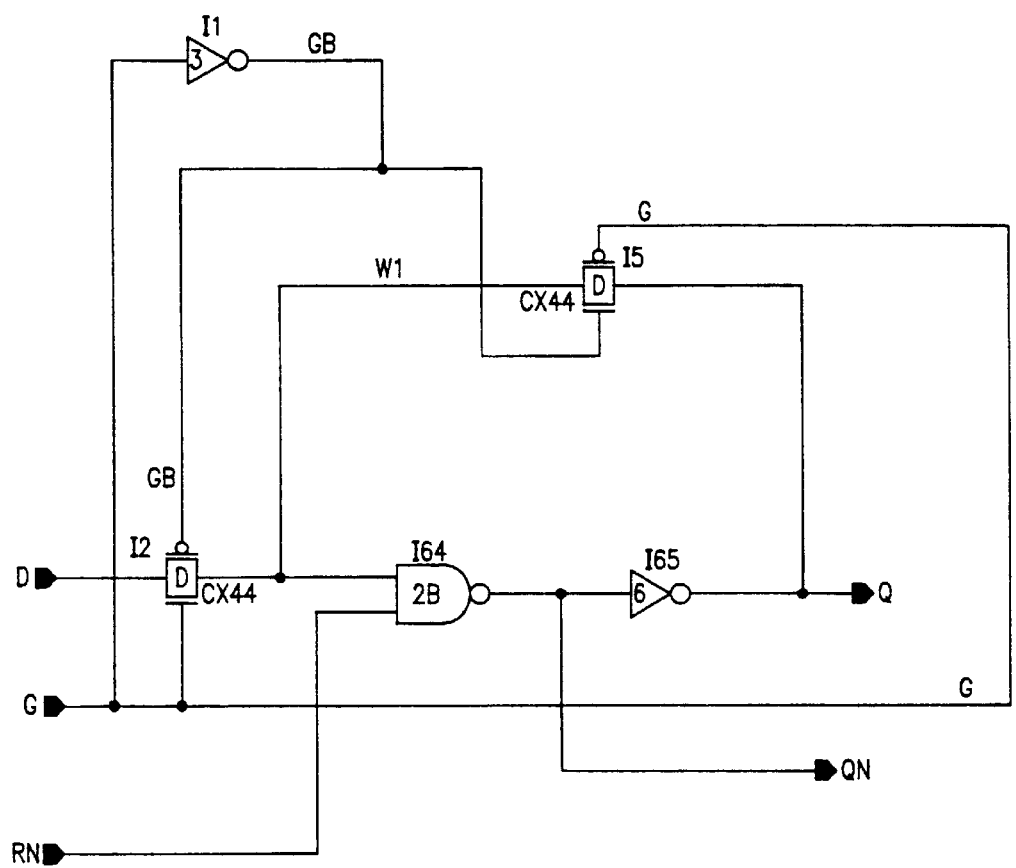
FIG. 5 is a circuit diagram for the latch used in the redundancy control logic block REDCOLLOG of FIG. 1.

Now referring to FIG. 5, the details of the latch used in the redundancy control logic block REDCOLLOG of FIG. 1 may be seen. The signal RN through NAND gate I64 and inverter I65 will force a zero on the output Q and one on the output QN. With RN being high, the signal G going high will transfer the input D to the output Q through switch I2 and NAND gate I64. With G then going low, switch I2 is turned off and switch I5 is turned on, and the output Q will be fed back to the input of the NAND gate I64, latching the Q and QN outputs of the circuit.

Figure 6A:
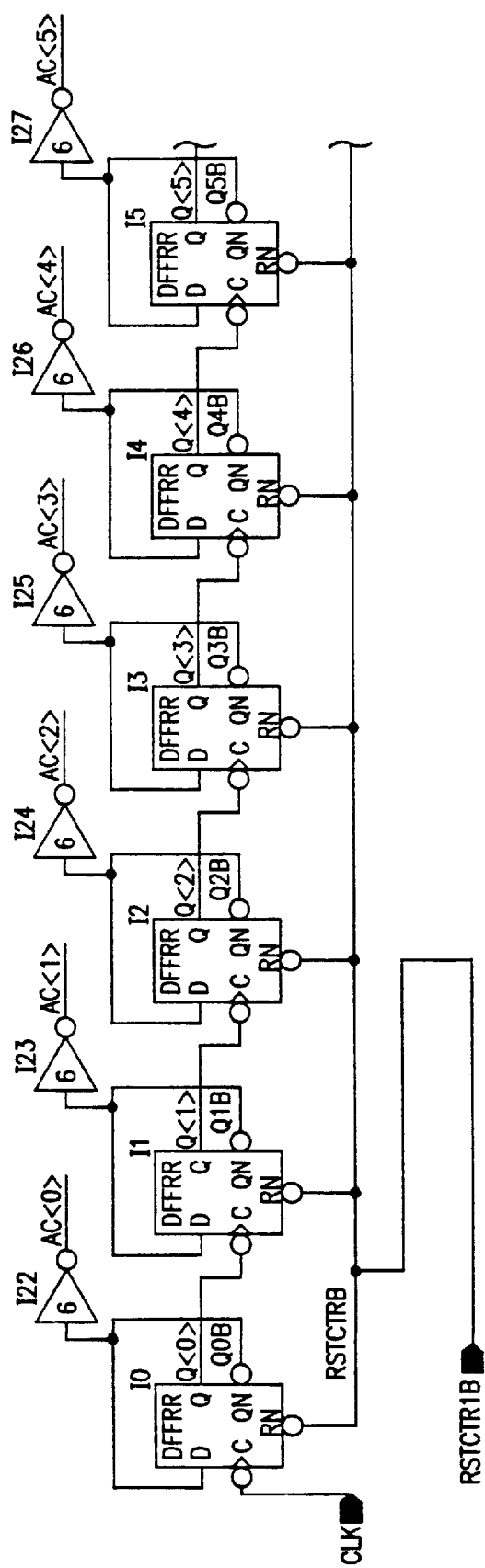
FIG. 6 is a circuit diagram for the column redundancy counters CRCTR of FIG. 4.
Figure 6B:
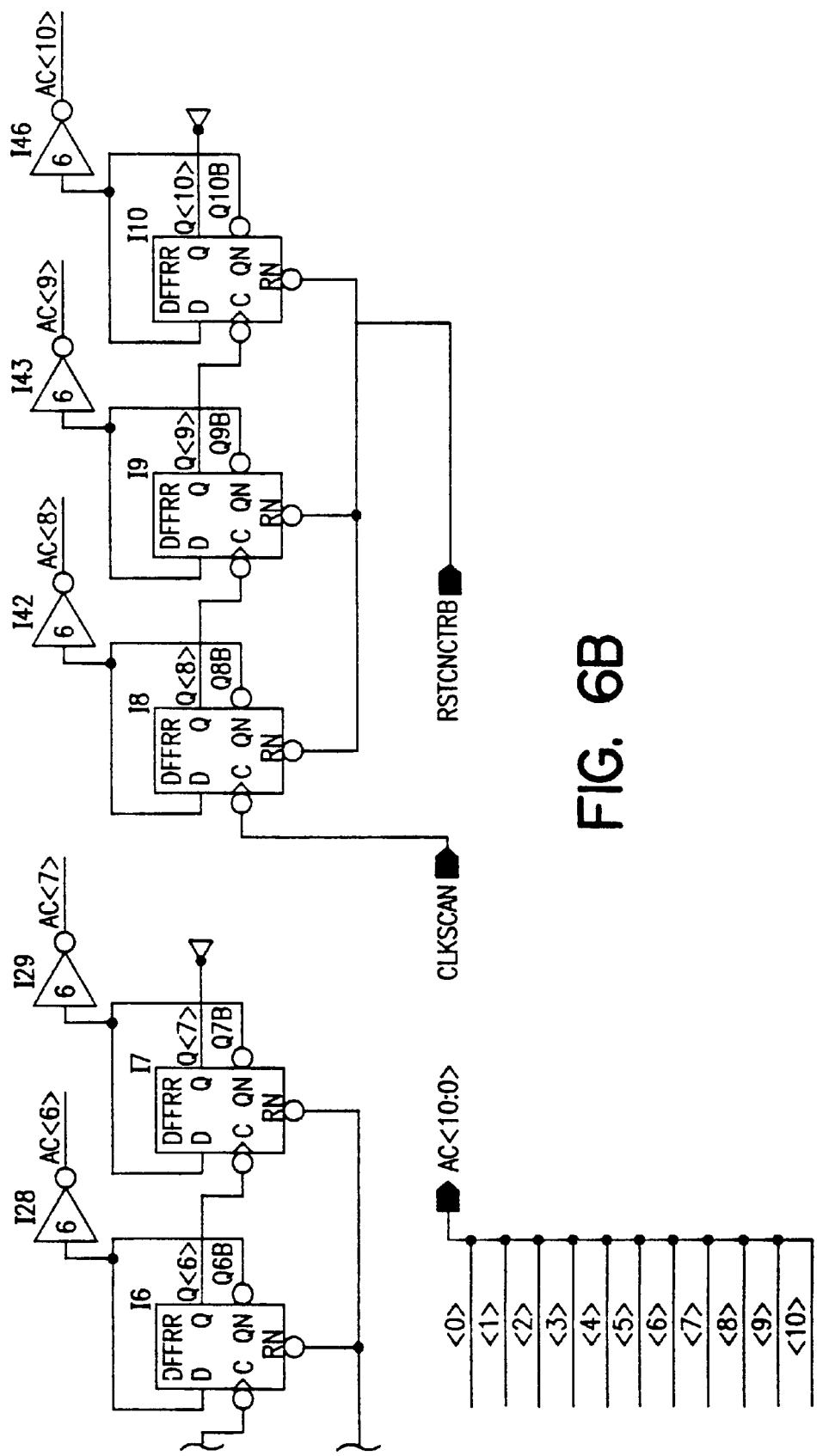

Now referring to FIG. 6, details of the column redundancy counters (CRCTR of FIG. 4) may be seen. As indicated before, the purpose of the column redundancy counters is to provide an equivalent column address or unique count indicative of which column driver COLDRV is then being selected by the column shift register (inside the COLDRV) and which scan (position of the 8:1 MUXes) is being selected by the column MUX decoder CMDEC.

The counters comprise a typical D flip-flop chain forming an 8-bit binary counter and a similar D flip-flop chain forming a typical 3-bit binary counter. The 8-bit counter serves to decode the 200 positions of the 200 column drivers, while the 3-bit counter serves to decode the 8:1 MUX of the column decoder.

Now referring to FIG. 7, the details of the column driver for the main memory array may be seen. The circuit includes two banks of sample and hold capacitors and their associated switches. Two banks are needed, since while one bank is being used during the writing of analog samples to memory, the other bank is sampling. The signals are thus inverted, in that signals SAB and SBB are the inverted forms of the signals SA and SB, respectively, SA and SB being non-overlapping signals. Transistor N3 is enabled by the respective stage of the shift register SR. Transistors P1, N1 and N2 and capacitor CA constitute one bank of sample and hold circuits. Transistors P2, N4 and N5 and capacitor CB constitute the other bank of sample and hold circuits. Current source IB2 provides the bias current for transistors N1 and N4. When in sampling, a typical op amp (not shown) is used in a feedback configuration to drive the input analog signal sample ARYIN, with ARYOUT being coupled to the negative terminal of the op amp. By using the op amp in the negative feedback loop, the input voltage is always exactly duplicated at the signal ASAMPN.

The comparator COMP is a typical MOS comparator. The comparator COMP and AND gate ND1 are used to compare the input signal with the signal output from the flash memory cell. The result is latched in latch L1, and is used to disable further programming by disabling the current source IB1 by turning off transistor N8 to pull the column to an inhibit voltage VCC (or VINH) through transistor P3. The compare enable signal COMPEN is used to strobe the comparator through AND gate ND1 in the compare period.

Transistor N6 is used to enable the voltage from the memory cell into ARYOUT in play mode. The shift register SR is used as an address decoder to enable one column driver at a time, starting from column driver number 0 sequentially to column driver number 199 in sampling and playing.

Figure 8:
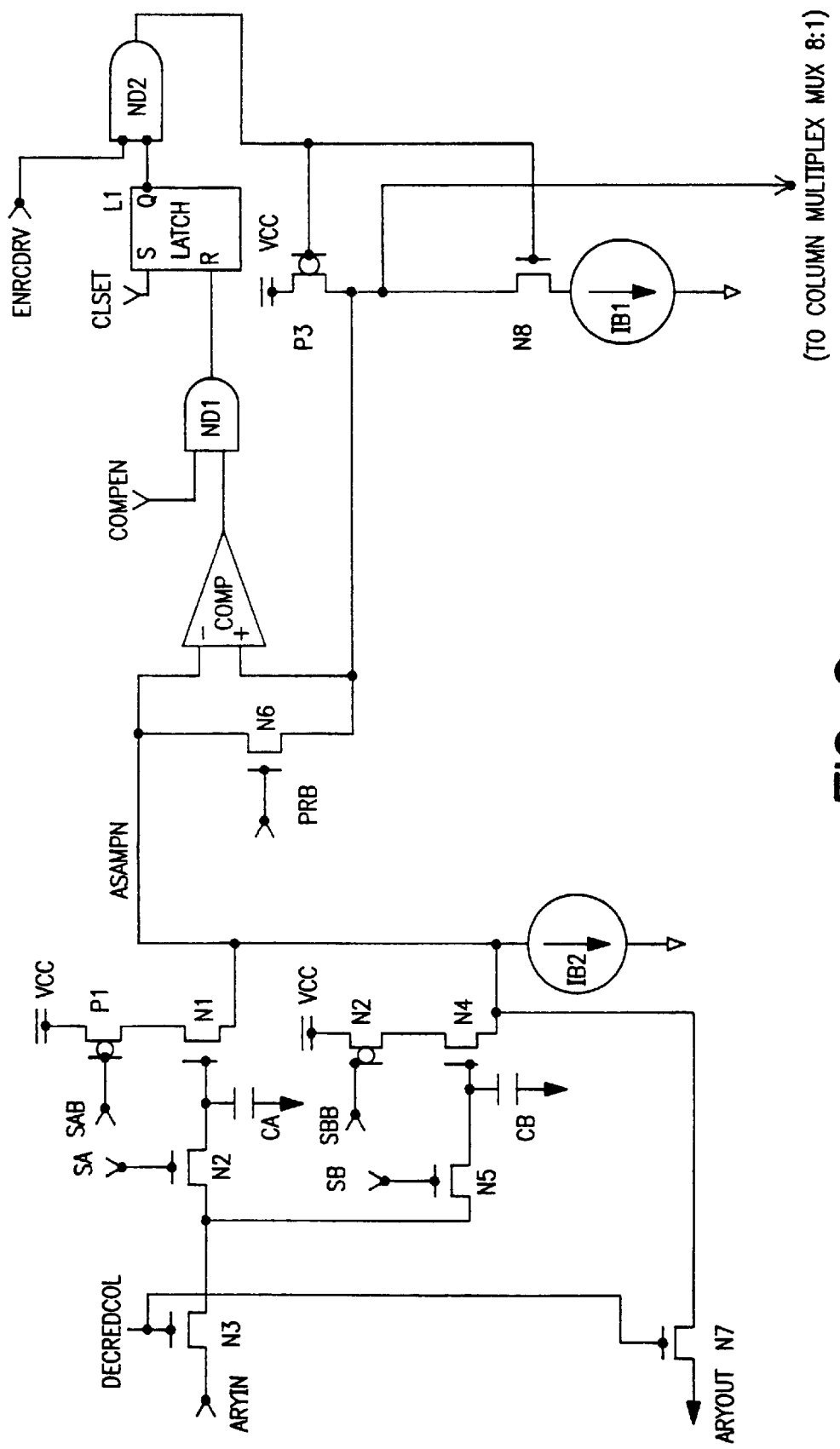
FIG. 8 is a circuit diagram for each of the redundancy column drivers.

Now referring to FIG. 8, details of the redundancy column driver may be seen. The redundancy column driver has minimum differences from the main array column driver, minimizing the additional circuit design and layout required. Accordingly, parts having the same identification are used to perform the same functions in the redundancy column driver as in the main array column driver.

The redundancy column driver and the main column driver are almost exactly the same except there is no shift register to enable the redundancy column driver. Instead, a signal DECREDCOL is used. This signal is provided from the column redundancy control logic of FIG. 4. It is enabled if a match between the values in the redundancy fuses and the current column address is found to indicate the current main array column is a bad column. Hence whenever the respective redundancy column is to be enabled, the input voltage needs to be sampled into the redundancy sample and hold in the write mode, or the memory cell output voltage needs to be output to ARYOUT in the play mode. Further, since the writing for the current samples happens at the next scan, an AND gate ND2 is added and gated with signal ENRCDRV to enable the redundancy column driver only at the beginning of the next scan. In the play mode, the signal ENRCDRV and the signal DECREDCOL are logically the same.

Circuit Operation:

The following describes the operation of the circuit. The memory cell used in the preferred embodiment is the source side injection (SSI) flash memory cell as described in Silicon Storage Technology, Inc. 1995 Datasheet, page 17.1–17.7. The cell is erased by poly-poly field enhanced tunneling by applying a high voltage on the gate and zero voltage on the source and drain. The cell is programmed by source side channel hot electron injection by applying a high voltage on the source, a small bias current on the drain, and a voltage on the gate. The programming is inhibited by turning off the current bias and pulling the drain to an inhibit voltage, typically $\geq$ the programming gate voltage. While the following description is specifically applicable to the foregoing cell, it may be easily modified to apply to other technologies such as EEPROM, ETOX flash, triple poly SSI flash, etc.

Record Operation:

The following description of writing in the present invention is similar to the description of writing in similar analog sample storage devices, such as in U.S. Pat. No. 5,220,531, by Trevor Blyth and Richard Simko and assigned to the same assignee as the present invention. The record operation begins with the periodic sampling of the analog input voltage and the placement of each sample into the respective sample and hold capacitor in each of the column drivers COLDRV0 through COLDRV199, starting from COLDRV0, and using the sampling clock PHIN, typically an 8 KHz clock. The shift register stage in each column driver (FIG. 7) will sequentially enable one sample and hold at a time for each sampling clock. When COLDRV199 finishes sampling, the actual writing of the memory cells begins.

For each row, the writing begins with a short period of erase, typically 1.25 ms, and then the programming cycle begins. It consists of multiple incremental programming level pulses. Each pulse consists of program and compare periods. The number of pulses are determined by the smallest allowable pulse width divided by the available total programming time for each scan, which is equal to the number of columns multiplied by the sampling rate minus the erase time, i.e.=200×125 $\mu$s–1.25 ms=23.75 ms. At the end of the 8th scan, the row counter increments and the process repeats.

Initially, all of the fuse sets are programmed with addresses out of the normal operating address range for the main array. Thus the analog sample storage device may be operated with the outputs of the comparators remaining inactive, i.e. redundancy is not enabled. Also by doing this, no extra enable/disable fuses are needed. The record and play operation can now proceed normally. At the time of factory testing, if bad columns are found, their equivalent addresses are programmed into the fuses. Then the method of the present invention for providing redundancy utilizes a scheme to latch and transfer the redundancy information, a scheme to multiplex the fuses, and control circuits to invoke the redundancy.

The latch and transfer scheme to hold the redundancy information is as follows. If a bad column has been found, at the respective time during sampling, the input voltage must be stored in a redundancy sample and hold until the end of the next scan (i.e. until the end of the scan in which the sample was taken, plus the following scan during which the redundancy sample and the rest of the samples taken in the previous scan are stored). This is accomplished by enabling the sample and hold capacitor in the appropriate redundancy column driver and storing the enable signal until the beginning of the next scan. Then the redundancy column driver is enabled for the actual writing of the redundancy memory cells. This is accomplished by the signals DECREDCOL0 and DECREDCOL1 for sampling, and ENRCDRV0 and ENRCDRV1 for enabling the actual writing. These signals are generated by the redundancy column control logic REDCOLLOG of FIG. 1, shown in detail in FIG. 4.

In this implementation, since there are only two redundancy column drivers, and when the writing process happens, all column drivers are used simultaneously, only two or less redundancy columns are capable of being used during any specific scan. Also since normal 8:1 column multiplexers are used for the redundancy column drivers, the redundancy columns may replace up to any two bad columns for any and all scans if the fuses are available for 16 redundancy columns.

The multiplexing of the fuses may be described as follows. Since the fuses in the preferred embodiment disclosed herein are implemented in 6 sets only, as shown in FIG. 1, the maximum number of bad main array columns that can be replaced with redundancy columns in this embodiment is 6, no matter what scan they appear in, though again with a maximum of 2 columns for any one scan. However, any number of fuse sets could be used, if desired, up to one for each redundant column (16 in the embodiment shown). The advantage of this approach is the efficient use of the additional redundancy column drivers. For example, only two redundancy column drivers are used to fix up to 16 bad columns in the main array depending on the number of fuse sets used, again with the limitation that only two bad columns could be fixed during any specific scan.

Note that the main array column drivers are not disabled during recording as in conventional approaches to column redundancy, i.e. the bad columns also get programmed. This greatly minimizes the additional circuits without affecting the circuit operation, i.e. the programming of a bad column does not hamper the operation of the charge pump used to supply the high voltage for programming, or other circuits on the integrated circuit.

Play Operation:

The play operation begins with the first memory cell output from the first column driver COLDRV0. The shift register inside all column drivers will sequentially enable one memory cell output at a time for each sampling clock PHIN from column driver COLDRV0 to column driver COLDRV199. When the COLDRV199 finishes reading, the process repeats at the first column due to wrap-around of the cyclic column shift register. At the end of the 8th scan, the row counter is incremented and the process repeats.

Thus during play time, if a bad column is found, the output voltage must be output from the redundancy column and not the bad column. This is accomplished by enabling the redundancy column driver and disabling the normal output ARYOUTN. The signals DECREDCOL0/1 and ENRCDRV0/1 are activated at this time by the redundancy control logic (FIGS. 1 and 4). The signals DECREDCOL0/1 are used to disable normal output ARYOUTN and enable the redundancy output ARYOUTR by NOR gate NOR1 and inverter INV1 turning off transistor N1 and turning on transistor N2, as shown in FIG. 1. Thus the normal column drivers are not disabled as in conventional redundant column approaches, since the outputs are switched at the top level.

The preferred embodiment of the present invention has been described herein with reference to use in analog signal sample storage and play back systems of the general type manufactured and sold by Information Storage Devices, assignee of the present invention. However the same is directly applicable to multilevel digital storage systems wherein more than the equivalent of one binary bit of information is stored in each storage cell by storing any of more than two discrete voltage levels in each cell, such as storing any one of 16 discrete voltage levels to represent four bits of information. Thus while certain preferred embodiments of the present invention have been disclosed and described herein, it will be understood by those skilled in the art that various changes in form and detail may be made therein without departing from the spirit and scope of the invention.

We claim:

1. A semiconductor memory addressable by an address within a first address range comprising:

an array of memory cells having a plurality of rows and columns, the array being divided into primary and redundant arrays of memory cells, the redundant array having at least one column of memory cells, the semiconductor memory being subject to the possibility of at least one faulty column of memory cells in the primary array;

a plurality of column drivers divided into primary column drivers and at least one redundant column driver, the primary column drivers being coupled to the plurality of columns of memory cells in the primary array, and the at least one redundant column driver being coupled to the at least one column of memory cells in the redundant array;

address lines having an address representative of a column in the primary array, the primary array being addressable over a second address range within and less than the first address range;

a plurality of fuse elements divided into at least one group of fuse elements, the at least one group of fuse elements to be programmed with an address of a faulty column in the primary array and alternatively with an address within the first address range and not within the second address range; and at least one comparator, each comparator being coupled to a respective group of fuse elements and to the plurality of address lines to compare the address in the plurality of fuse elements and the address on the plurality of address lines, the comparator enabling a redundant column driver and disabling the primary column driver associated with the faulty column if the address on the plurality of address lines is the same as the address in the plurality of fuse elements.

2. The semiconductor memory of claim 1 wherein each of the plurality of column drivers are identical.

3. The semiconductor memory of claim 1 wherein the plurality of column drivers comprise a plurality of primary column drivers and two redundant column drivers.

4. The semiconductor memory of claim 1 wherein the fuse elements are coupled to a plurality of serial latches for programming of each group with an identification of a faulty column in the primary array.

5. The semiconductor memory of claim 1 wherein each of the plurality of fuse elements includes a pair of flash memory cells.

6. The semiconductor memory of claim 5 wherein each of the plurality of fuse elements includes a differential fuse circuit for providing a fuse output responsive to the differential in programming between the pair of flash memory cells.

7. A semiconductor memory addressable by an address within a first address range comprising:
- an array of memory cells having a plurality of rows and columns, the array being divided into primary and redundant arrays of memory cells, the redundant array having at least one column of memory cells, the semiconductor memory being subject to the possibility of at least one faulty column of memory cells in the primary array;
- a plurality of column drivers divided into primary column drivers and at least one redundant column driver, the primary column drivers being coupled to the plurality of columns of memory cells in the primary array, and the at least one redundant column driver being coupled to the at least one column of memory cells in the redundant array;
- a plurality of fuse elements forming at least one group of fuse elements;
- a plurality of serial latches coupled to the corresponding plurality of fuse elements for programming of each group of fuse elements with an identification of a faulty column in the primary array;
- address lines having an address representative of a column in the primary array, the primary array being addressable over a second address range within and less than the first address range; and
- at least one comparator, each comparator being coupled to a respective group of fuse elements and to the plurality of address lines to compare the address in the plurality of fuse elements and the address on the plurality of address lines, the comparator enabling a redundant column driver and disabling the primary column driver associated with the faulty column if the address on the plurality of address lines is the same as the address in the plurality of fuse elements.

8. A semiconductor memory addressable by an address within a first address range comprising:
- an array of memory cells having a plurality of rows and columns, the array being divided into primary and redundant arrays of memory cells, the redundant array having at least one column of memory cells, the semiconductor memory being subject to the possibility of at least one faulty column of memory cells in the primary array;
- a plurality of column drivers divided into primary column drivers and at least one redundant column driver, the primary column drivers being coupled to the plurality of columns of memory cells in the primary array, and the at least one redundant column driver being coupled to the at least one column of memory cells in the redundant array;
- a plurality of fuse elements forming at least one group of fuse elements for programming of each group with an identification of a faulty column in the primary array, each of the fuse elements including a pair of flash memory cells;
- address lines having an address representative of a column in the primary array, the primary array being addressable over a second address range within and less than the first address range; and
- at least one comparator, each comparator being coupled to a respective group of fuse elements and to the plurality of address lines to compare the address in the plurality of fuse elements and the address on the plurality of address lines, the comparator enabling a redundant column driver and disabling the primary column driver associated with the faulty column if the address on the plurality of address lines is the same as the address in the plurality of fuse elements.

9. The semiconductor memory of claim 8 wherein each of the plurality of fuse elements includes a differential fuse circuit for providing a fuse output responsive to the differential in programming between the pair of flash memory cells.

10. A semiconductor memory addressable by an address within a first address range comprising:
- an array of memory cells having a plurality of rows and columns, the array being divided into primary and redundant arrays of memory cells, the redundant array having at least one column of memory cells;
- a plurality of column drivers divided into primary column drivers and at least one redundant column driver, the primary column driver coupled to the plurality of columns of memory cells in the primary array, and the at least one redundant column driver being coupled to the at least one column of memory cells in the redundant array;
- address lines having an address representative of a column in the primary array, the primary array being addressable over a second address range within and less than the first address range;
- a plurality of fuse elements divided into at least one group of fuse elements, the at least one group of fuse elements to be programmed with an address of a faulty column in the primary array and alternatively to be programmed with an address within the first address range and not within the second address range; and
- at least one comparator, each comparator being coupled to a respective group of fuse elements and to the plurality of address lines, the comparator enabling a redundant column driver and disabling the primary column driver associated with the faulty column if the address on the plurality of address lines is the same as the address in the plurality of fuse elements.

11. The semiconductor memory of claim 10 wherein each of the plurality of column drivers are identical.

12. The semiconductor memory of claim 10 wherein the plurality of column drivers comprise a plurality of primary column drivers and two redundant column drivers.

13. The semiconductor memory of claim 10 wherein each of the plurality of fuse elements includes a pair of reprogrammable fuses in the form of flash memory cells.

14. The semiconductor memory of claim 13 wherein each of the plurality of fuse elements includes a differential fuse circuit for providing a fuse output responsive to the differential in programming between the pair of flash memory cells.

15. A method of providing redundancy in a semiconductor memory addressable by an address within a first address range, comprising:

providing an array of memory cells having a plurality of rows and columns, the array being divided into primary and redundant arrays of memory cells, the redundant array having at least one column of cells, the primary array being addressable over a second address range within and less than the first address range;

providing a plurality of fuse elements divided into at least one group of fuse elements and programming at least one group with an address of a respective faulty row in the primary array;

comparing the address in each group of fuse elements with an address of a selected column; and enabling a redundant column driver and disabling a primary column driver associated with the faulty row when the address in a group of fuse elements matches the address of the selected column.

16. The method of claim 15 wherein each group of fuse elements not programmed with an address of a faulty row in the primary array is programmed with an address within the first address range and not within the second address range.

17. The method of claim 16 wherein each of the fuse elements is a pair of flash memory cells.

18. The method of claim 15 wherein the semiconductor memory is a memory for storing more than two discrete voltage levels representing a digital signal of more than one bit.

19. The method of claim 15 wherein the semiconductor memory is a memory for storing $2^N$ discrete voltage levels representing a digital signal of N bits, where N is greater than 1.

20. A method of storing a sample of an analog signal in a redundant column, comprising:

providing an array of memory cells having a plurality of rows and columns, the array being divided into primary and redundant arrays of memory cells, the redundant array having at least one column of memory cells;

providing a plurality of column drivers divided into primary column drivers and a redundant column driver, the primary column drivers being coupled to the plurality of columns in the primary array, and the redundant column driver being coupled to the at least one column of memory cells in the redundant array;

detecting a bad column during a current scan of memory cells;

storing a sample of an analog signal in the redundant column driver; and enabling the redundant column driver to program the sampled analog signal in a redundant column during a next scan of memory cells.

* * * * *

UNITED STATES PATENT AND TRADEMARK OFFICE
CERTIFICATE OF CORRECTION

PATENT NO. : 6,002,620  
APPLICATION NO. : 09/005098  
DATED : December 14, 1999  
INVENTOR(S) : Tran et al.

Page 1 of 1

It is certified that error appears in the above-identified patent and that said Letters Patent is hereby corrected as shown below:

In Item [54], line 3, please insert --INTEGRATED CIRCUITS-- after "MEMORY"

Signed and Sealed this

Twenty-sixth Day of February, 2008

JON W. DUDAS  
*Director of the United States Patent and Trademark Office*

UNITED STATES PATENT AND TRADEMARK OFFICE
CERTIFICATE OF CORRECTION

PATENT NO. : 6,002,620  
APPLICATION NO. : 09/005098  
DATED : December 14, 1999  
INVENTOR(S) : Tran et al.

Page 1 of 1

It is certified that error appears in the above-identified patent and that said Letters Patent is hereby corrected as shown below:

In Item [54], line 3 and Column 1, line 3, please insert --INTEGRATED CIRCUITS-- after "MEMORY"

This certificate supersedes the Certificate of Correction issued February 26, 2008.

Signed and Sealed this

Eighth Day of April, 2008

JON W. DUDAS  
*Director of the United States Patent and Trademark Office*